United States Patent [19]

Selgas, Jr. et al.

[11] Patent Number: 5,440,803
[45] Date of Patent: Aug. 15, 1995

[54] INTEGRATED CIRCUIT EXTRACTION TOOL

[75] Inventors: Thomas D. Selgas, Jr., Garland; Sean T. Crowley, Plano; Paul J. Pascarelli, Southlake, all of Tex.

[73] Assignee: Cyrix Corporation, Richardson, Tex.

[21] Appl. No.: 63,134

[22] Filed: May 17, 1993

[51] Int. Cl.6 .............................................. H05K 13/00
[52] U.S. Cl. ............................................. 29/764; 29/267; 254/120; 254/131
[58] Field of Search ................. 29/764, 758, 267; 254/120, 131, 21, 25, 27, 28

[56] References Cited

U.S. PATENT DOCUMENTS

| | | | |
|---|---|---|---|
| 3,559,267 | 2/1971 | Castellani | 29/758 X |
| 4,141,138 | 2/1979 | Quick | 29/764 X |
| 4,519,130 | 5/1985 | Schaefer | 29/764 |
| 4,756,078 | 7/1988 | Dougherty et al. | 29/764 |
| 4,852,925 | 8/1989 | Lodin | 29/758 X |
| 4,970,779 | 11/1990 | Chen | 29/764 |

FOREIGN PATENT DOCUMENTS 0052947  3/1987  Japan .................................. 29/764

OTHER PUBLICATIONS

Information Sheets entitled "PGA Sockets", Amp Incorporated, Product Information Center, pp. 1-2.

Primary Examiner—Carl E. Hall
Attorney, Agent, or Firm—Andrew S. Viger; John L. Maxin

[57] ABSTRACT

An integrated circuit extraction tool includes an elongated base having a first end and second end. A first set of teeth are provided on the first end and a second set of teeth are provided on the second end. The first set of teeth are spaced at a first spacing distance and the second set of teeth are spaced at a second spacing distance. In the preferred embodiment, the first set of teeth are spaced to correspond with the spacing between pins of a integrated circuit to be extracted and the second set of teeth are spaced at a distance to correspond to the spacing between base portions of a socket's connectors. One or both of the ends may be angled at ninety degrees to allow integrated circuit removal with minimal clearance.

7 Claims, 3 Drawing Sheets

INTEGRATED CIRCUIT EXTRACTION TOOL

TECHNICAL FIELD OF THE INVENTION

This invention relates in general to devices for removing integrated circuits from respective sockets, and more particularly to an integrated circuit extracting tool for extracting PGA packages from respective sockets.

BACKGROUND OF THE INVENTION

In designing an electronic device, sockets are often provided on the integrated circuit board for receiving integrated circuits. While it is less expensive to solder an integrated circuit directly onto an integrated circuit board rather than provide a socket for receiving the integrated circuit, consumers are willing to pay the additional price where the component may be frequently replaced or upgraded. For example, in a computer motherboard, certain components, such as the microprocessor and coprocessor, are generally provided with sockets. Because of the large number of pins on these components, removal of a soldered processor or coprocessor would be highly labor-intensive and would have a high likelihood of damage to the motherboard if such removal was attempted.

Apart from replacement of defective pads, upgrading a system's microprocessor is becoming increasingly popular and is considered an important feature by many users. By replacing an older technology microprocessor, such as the INTEL 80386, with a higher technology, but compatible processor, the useful life of a computer system may be extended by several years. The cost of replacing just the microprocessor is significantly cheaper than replacing an entire motherboard or buying a new system. Accordingly, the user's investments in other peripheral devices, such as video cards, modems, disk drives, serial ports and floppy drives, which are easily transferred to a new system, is protected.

Most removable microprocessors are designed to fit a PGA (Pin Grid Array) socket. A PGA socket 10 is shown in FIG. 1a (top view) and FIG. 1b (side view). The PGA socket 10 comprises a rectangular grid of receptacles 2, each receptacle 12 encased in a conductive metal, which extends through to connectors 14. The connectors 14 include a base portion 16 and pin portion 18.

FIG. 1c illustrates a side view of a typical arrangement where a first socket 20 is soldered into a printed circuit board 22. A second socket 24 is inserted into the first socket 20, such that it may be removed at a later time. The integrated circuit 26, for example, a microprocessor, is inserted into the second socket 24. The integrated circuit 26 has pins 28 which correspond to the connectors 14 of the socket 24; however, the pins 28 of the integrated circuit 26 typically do not have a base portion 16. Further, the pins 28 of the integrated circuit 26 are typically fabricated from a highly conductive material which may be more malleable than the conductors 14 of the socket 24.

Removal of a microprocessor from a computer system is sometimes difficult due to the number of devices in the computer cabinet. Generally, it is undesirable to remove the motherboard from the cabinet prior to removal of the microprocessor from the motherboard, since the motherboard is attached to the cabinet with several screws and the motherboard may crack if the screws are replaced with excessive force. A number of devices have been designed for removal of the microprocessor from the socket; however, these prior devices require clearance on all four sides of the microprocessor for easy removal and on top. Especially with today's low profile cabinets, such clearance is not universally available. Consequently, excessive work is necessary to remove the microprocessor.

Further, prior art extraction tools are designed to mate with the pins of the integrated circuit, not the base portion of the socket. Thus, the socket must be partially extracted in order to allow the extraction tool to mate with the pin portion of the socket connectors. Accordingly, the difficulty in removing the socket is increased.

Therefore, a need has arisen in the industry for a integrated extraction tool which allows for easy and safe removal of an integrated circuit from a motherboard with a minimum of clearance.

SUMMARY OF THE INVENTION

The integrated circuit extraction tool of the present invention includes an elongated base having a first end and second end. A first set of teeth are provided on the first end and a second set of teeth are provided on the second end. The first set of teeth are spaced at a first spacing distance and the second set of teeth are spaced at a second spacing distance. In the preferred embodiment, the first set of teeth are spaced to correspond with the spacing between pins of a integrated circuit to be extracted and the second set of teeth are spaced at a distance to correspond to the spacing between base portions of a socket's connectors. Also, the first end is disposed at approximately 90° from the main portion of the elongated base to allow extraction of integrated circuits where clearance may be a problem. The second end is disposed coplanar with base to remove chips where an obstruction exists over the integrated circuit to be removed. The base is bent approximately fifteen degrees between the first and second ends to provide additional leverage.

The present invention provides significant advantages over the prior art. First, the same tool may be used to remove both integrated circuit packages and sockets. Second, the extraction tool may be used with a minimum amount of clearance, either horizontal or vertical.

BRIEF DESCRIPTION OF THE DRAWINGS

For a more complete understanding of the present invention, and the advantages thereof, reference is now made to the following descriptions taken in conjunction with the accompanying drawings, in which:

FIG. 2b illustrates a side view of the extraction tool of FIG. 2a;

FIG. 2c illustrates a top view of the extraction tool of FIG. 2a;

DETAILED DESCRIPTION OF THE PREFERRED EMBODIMENTS

The present invention is best understood in reference to FIGS. 2–5 of the Drawings, like numerals used to indicate like portions of the various drawings.

Figure 1A:
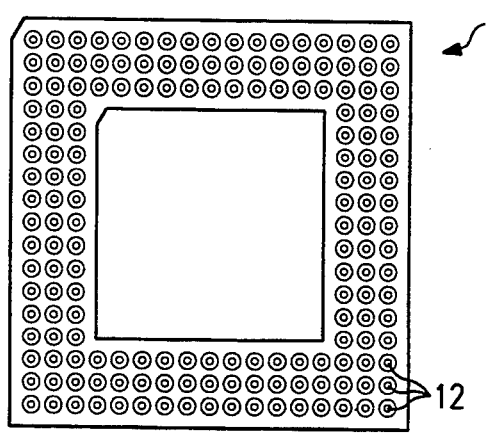
FIG. 1a illustrates a top view of a pin grid array (PGA) socket.
Figure 1B:
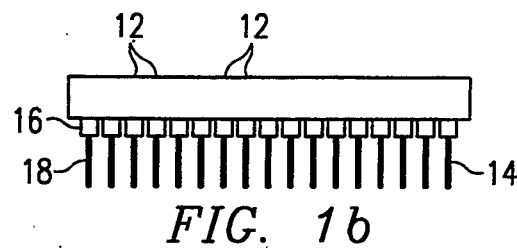
FIG. 1b illustrates a side view of a PGA socket.
Figure 1C:
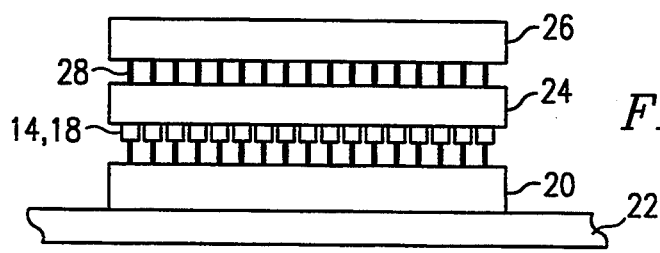
FIG. 1c illustrates a side view of a integrated circuit disposed in a PGA socket coupled to a printed circuit board.

FIG. 1a illustrates a perspective view of the integrated circuit extraction tool of the present invention. The extraction tool 30 includes a base portion 32 terminating in first and second end portions 34 and 36. The first portion 34 is angled from the main base portion 32 by a angle of approximately 90 degrees. A first set of teeth 38 are formed in the first end portion 34 and a second set of teeth are formed in the second end portion 36. The main base portion 32 includes bend 41. In the preferred embodiment, bend 41 is approximately fifteen degrees, although a greater bend may be used. A gusset 42 is formed in the base portion to add strength to the extraction tool 30. In the preferred embodiment, the extraction tool 30 is formed from a metal material, such as steel; however other materials could be used as well, so long as they have sufficient strength.

Figure 2A:
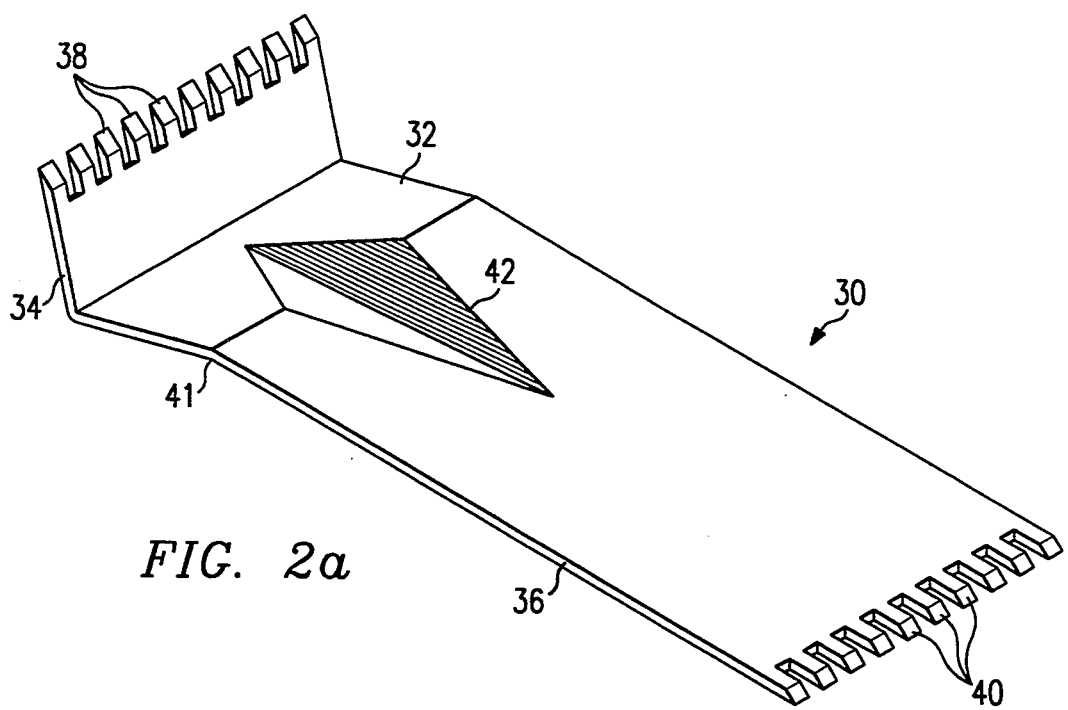
FIG. 2a illustrates a perspective view of an integrated circuit extraction tool.
Figure 2B:
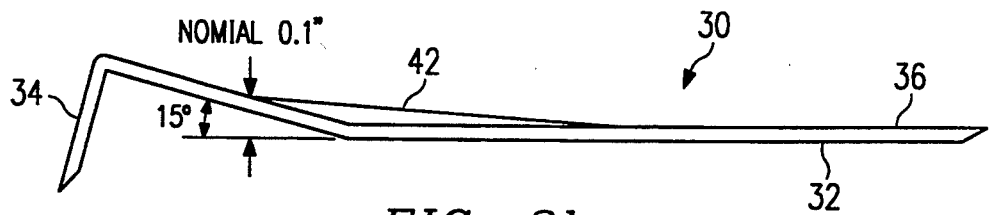
Figure 2C:
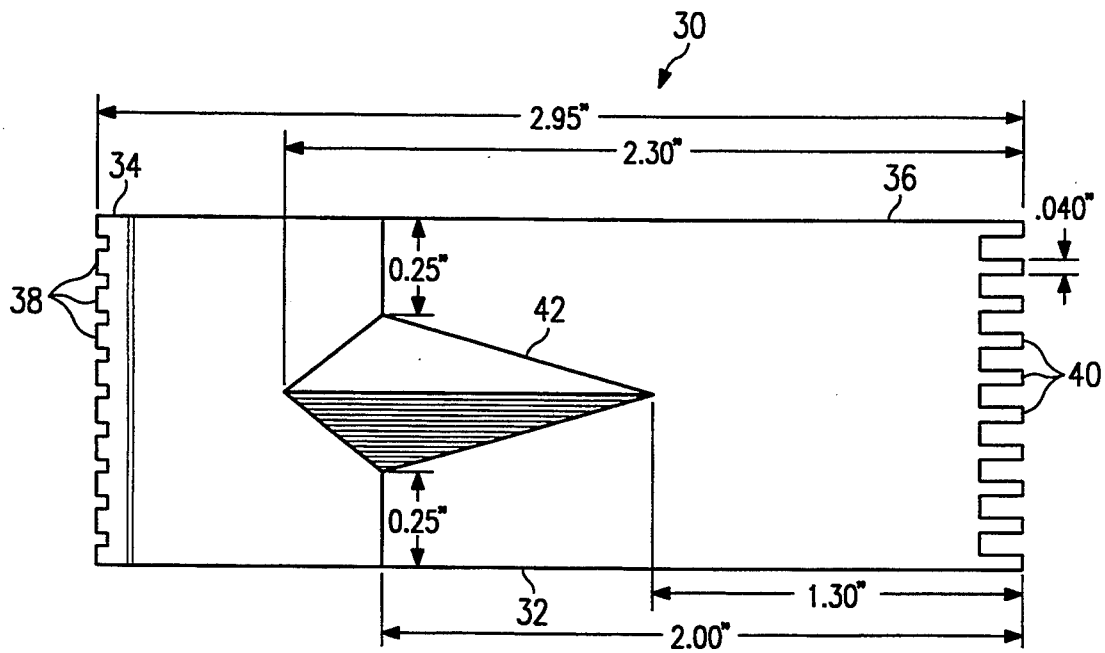

FIGS. 2b–c illustrate views of the extraction tool 30 with dimensions for a preferred embodiment for a PGA package. As shown in FIG. 2b, the teeth 38 and 40 terminate in chisel points to facilitate insertion of the device between the device to be extracted and a socket.

Figure 3A:
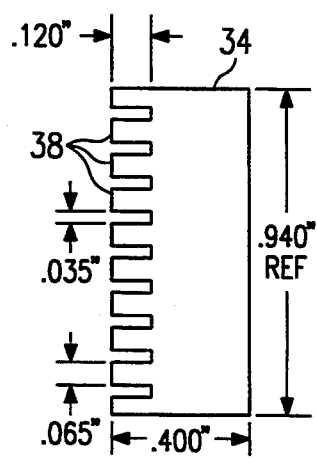
FIGS. 3a–b illustrate the first and second teeth portions of the extraction tool.
Figure 3B:
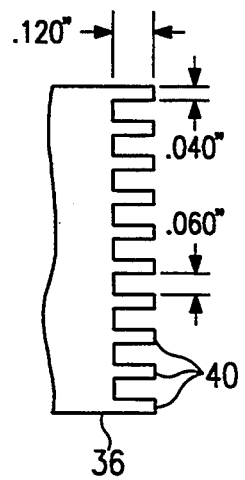

The first and second sets of teeth are shown in greater detail in connection with FIG. 3a and FIG. 3b, respectively. As can be seen in FIG. 3a, the spacing between the teeth 38 is 0.035". This space corresponds to the pins 28 of an integrated circuit for insertion in a PGA socket. The teeth have a width of 0.065", which corresponds to the spacing between the pins 28.

For the second set of teeth 40, shown in FIG. 3b, the spacing between the teeth 40 is 0.060", corresponding to the base portion 16 of a PGA socket. The width of the teeth 40 is 0.040", corresponding to the spacing between the base portions 16. Because the pins 28 are inserted into the base portions 18, the sum of the width of the teeth plus the spacing distance between is the same for both the first set of teeth 38 and the second set of teeth 40.

In the illustrated embodiment, the PGA package to which the tool is designed uses 0.018" diameter pins having 0.100" spaced centers. The dimensions of the tool 30 could be adjusted to any size spacing desired for other package types.

Figure 4A:
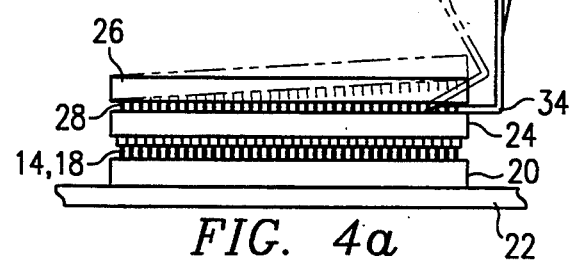
FIG. 4a–c illustrate the extraction tool as used to remove an integrated circuit from a socket.

FIG. 4a illustrates the use of the extraction tool 30 to remove an integrated circuit 26 from a socket 24.i Socket 24 is inserted in socket 20, which is soldered to the printed circuit board 22. A double-socketed arrangement may be used, for example, where socket 24 provides decoupling capacitors or other components, or in order to protect the pins of the integrated circuit 26. The extraction tool 30 has its first portion 38 inserted in between the integrated circuit 26 and the socket 24 such that the pins 28 are spaced between teeth 38. In the preferred embodiment, second end 40 is pushed forward as a lever arm to provide a force to separate the integrated circuit 26 from the socket 24. After providing an initial separation, the extraction tool may be used on the remaining three sides of the integrated circuit 26= to provide separation. Generally, a single lever action on each side of the integrated circuit 26 is sufficient to allow hand removal of the integrated circuit 26 from the socket 24.

By moving the lever arm forward as shown in FIG. 4a, damaging forces on the integrated circuit 26 are reduced. Because the first end is angled at approximately 90 degrees from the base portion 32 and because separation may be effected by a lever action toward the center of the integrated circuit 26, the extraction tool requires very little clearance from adjacent devices.

Figure 4B:
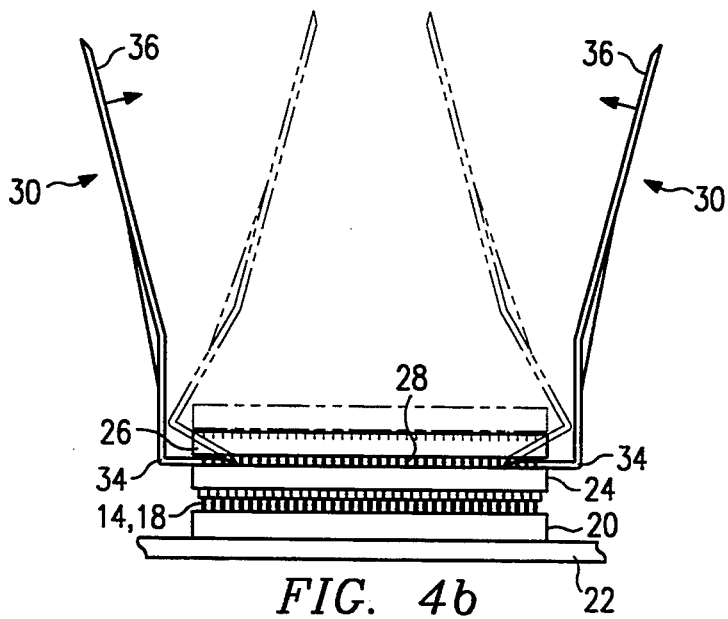

A second use of the tool to remove the integrated circuit is shown in FIG. 4b. In this case, two tools 30 are used on opposite sides of the integrated circuit 26. Once the first end 34 is positioned between the integrated circuit 26 and the socket 24, the second ends 36 of the tool 30 may be pulled together, using one hand, to extract the pins 28 from the holes 12 of the socket 24. The bend 41 allows a increased lever arm to remove the integrated circuit 26 before the two tools 30 meet. The two tools 30 may be lifted along with the integrated circuit 26 for complete removal.

The second end 36 of the extraction tool 30 may be used to remove the socket 24 from another socket on the printed circuit board 22. In this case, the second end 36 of the extraction tool is placed between the first socket 20 and the second socket 24. An upwards lever action of the extraction tool 30 will separate the two sockets 20 and 24.

Figure 4C:
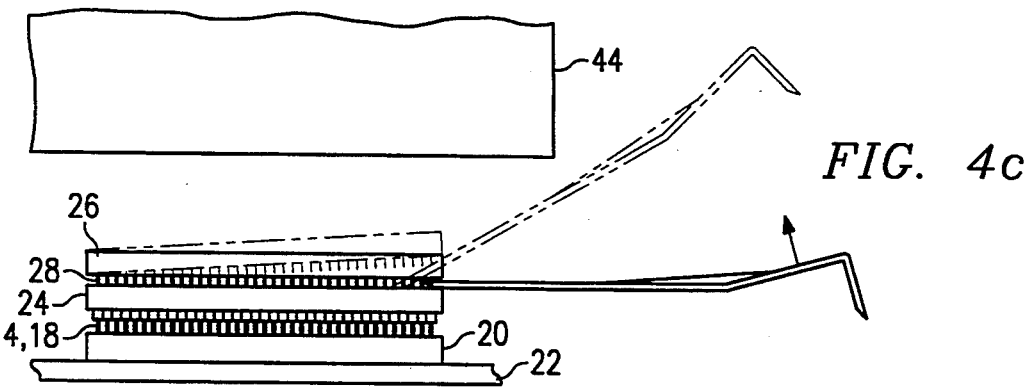

The second end 36 is particularly useful where a integrated circuit to be removed is located below an obstruction, such as a drive bay 44, as shown in FIG. 4c. When using the second end 36 to remove a integrated circuit 26 or socket 24, the extraction tool is relatively flat and can easily reach underneath an obstruction, even with a vertical clearance of less than one inch. The fifteen degree bend 41, however, allows for additional leverage to facilitate removal of the integrated circuit 26 (or socket 24).

Figure 5:
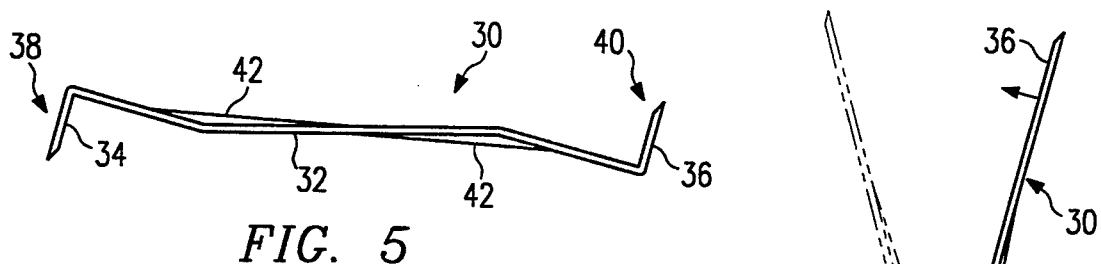
FIG. 5 illustrates a second embodiment of the extraction tool of the present invention.

FIG. 5 illustrates a second embodiment of the present invention where both the first and second ends 34 and 36 of the extraction tool 30 are angled at right angles with respect to the main base portion 32 to allow both integrated circuits and sockets to be removed in instances where clearance in minimal.

The present invention provides significant advantages over the prior art. The two different sets of teeth correspond to different base and pin sizes. A single tool is useful for a variety of computer configuration where it is not known in advance whether the integrated circuit to be removed will have obstructions either on the side of the integrated circuit or over the integrated circuit. Using two of the chip extraction tools described, an integrated circuit can be easily removed using one hand in one action.

Although the Detailed Description of the invention has been directed to certain exemplary embodiments, various modifications of these embodiments, as well as alternative embodiments, will be suggested to those skilled in the art. For example, spacings other than those specifically described herein may be provided for package types other than the PGA type described herein.

The invention encompasses any modifications or alternative embodiments that fall within the scope of the Claims.

What is claimed is:

1. A tool for extracting an integrated circuit from a socket comprising:

(a) a first and a second member, each member having a proximal end forming a set of teeth, a distal end forming a set of teeth, and a base portion spanning therebetween, the proximal end being disposed at an angle to the base portion;

(b) in an engaged position, the first and second members being disposed adjacent and along opposing first and second sides of the integrated circuit respectively, the proximal end of each member being interposed between a bottom surface of the integrated circuit and an upper surface of the socket, each set of teeth engaging a plurality of pins on the integrated circuit: and (c) in an applied position, first and second inwardly normal forces applied to the respective base portions of the first and second members are translated to a first and a second lifting force substantially normal to the bottom surface of the integrated circuit.

2. The tool of claim 1 wherein the set Of teeth on the proximal ends have a first width and a first spacing and the set of teeth on the distal ends have a second width and a second spacing.

3. The tool of claim 2 wherein the first width and the first spacing corresponds to a spacing between and a diameter of the plurality of pins of the integrated circuit, respectively.

4. The tool of claim 1 wherein the base portion of the first and second members forms a curvature of substantially 15 degrees between the proximal and distal ends.

5. The tool of claim 1 further comprising a gusset formed on the base portion, of both the first and second members, between the respective proximal and distal ends.

6. The tool of claim 1 wherein the set of teeth on the proximal end, of both the first and the second members, form chisel points.

7. The tool of claim 1 wherein the set of teeth on the distal end, of both the first and the second members, form chisel points.

* * * * *